United States Patent [19]

Walker et al.

[11] Patent Number: 4,891,837
[45] Date of Patent: Jan. 2, 1990

[54] VOICE CONTROL CIRCUIT FOR A COMMUNICATION TERMINAL

[75] Inventors: Michael Walker, Baltmannsweiler; Günter Köhler, Kirchheim, both of Fed. Rep. of Germany

[73] Assignee: Alcatel N.V., Amsterdam, Netherlands

[21] Appl. No.: 194,307

[22] Filed: May 16, 1988

[30] Foreign Application Priority Data

May 15, 1987 [DE] Fed. Rep. of Germany ....... 3716246
Jul. 23, 1987 [DE] Fed. Rep. of Germany ....... 3724346
Feb. 20, 1988 [DE] Fed. Rep. of Germany ....... 3805357

[51] Int. Cl.[4] ........................................... H04M 1/60
[52] U.S. Cl. .................................... 379/390; 379/388; 381/106
[58] Field of Search .................... 381/68, 684, 94, 96, 381/102, 106, 107, 111, 72, 113; 379/388, 389, 390, 395, 387

[56] References Cited

U.S. PATENT DOCUMENTS

| | | | |
|---|---|---|---|
| 4,240,037 | 12/1980 | Rubin | 330/127 |
| 4,543,665 | 9/1985 | Sotelo et al. | 379/388 X |
| 4,550,426 | 10/1985 | Gillig et al. | 381/46 |
| 4,677,678 | 6/1987 | McCutchen | 381/72 |
| 4,696,032 | 9/1987 | Levy | 379/390 |
| 4,718,099 | 1/1988 | Hotvet | 381/68.4 |

FOREIGN PATENT DOCUMENTS 0219635 3/1985 Fed. Rep. of Germany ...... 379/388
0039109 11/1981 France .
2179807 3/1987 United Kingdom .

OTHER PUBLICATIONS

Patent Abstracts of Japan, Band 9, Nr. 106 (E-313)[1829], 10 May 1985; & JP-A-59 230 356 (Matsushita Denki Sangyo K.K.) 24 Dec. 1984.
"Die neue sprachgesteuerte Freisprecheinrichtung fur die Produktfamilie INTERMAT", V. M. Slawik et al., Elektrisches Nachrichtenwesen, Band 53, No. 4, 1978.
"Voice Controlled Handsfree Subset for the Intermat Range", M. Slawik, Electrical Comm., vol. 53, No. 4, 1978.

Primary Examiner—Jin F. Ng
Assistant Examiner—Randall Vaas
Attorney, Agent, or Firm—Christie, Parker & Hale

[57] ABSTRACT

A voice control circuit controls the volume range of the voice signals in a communication terminal, such as a video telephone having a hands-free facility. In a hands-free facility, the signal-to-noise ratio is lower than in telephones with handset. To avoid audible feedback, hands-free facility conventionally includes a volume control circuit which decreases or increases the gain in the receive path as the gain in the set path increases or decreases. The problem to be solved is to utilize the maximum possible loop gain without reducing the gain in the receive path. The idea is to place behind the microphone (50) a controllable compandor (52) in which the signal voltages from the microphone (50) are
A. compressed if they lie above a predetermined level,
B. expanded if they lie below the predetermined level, and C. imparted maximum gain if they have the predetermined level. The predetermined signal level, which corresponds to the compression set point, is varied by a control circuit (90) as a function of the ambient noise.

19 Claims, 10 Drawing Sheets

VOICE CONTROL CIRCUIT FOR A COMMUNICATION TERMINAL

DESCRIPTION

Technical Field

The present invention relates to a voice control circuit for a communication terminal comprising
a microphone connected to a transmission channel via a send path,
a loudspeaker connected to the transmission channel via a receive path, and
a control unit determining the gain imparted to the signals in the send path.

CLAIM FOR PRIORITY

This application is based on and claims priority from applications first filed in the Federal Republic of Germany on May 15, 1987, July 23, 1987 and Feb. 20, 1988 under Ser. Nos. 37 16 246, 37 24 346 and 38 05 357 respectively.

BACKGROUND ART

A hands-free facility for telephones includes a circuit for controlling the dynamic range of the voice signals ("Elektrisches Nachrichtenwesen", Vol. 53 (1978), No. 4, pp. 288 to 293). It offers to the user a number of advantages: The conversation can be conducted without a handset, making it possible to use both hands during the call, possibly for taking notes or flicking through files, and so on. Also, the user has greater freedom of movement because he can now talk further from the telephone set. Since the voice of the distant party, the B-subscriber, is reproduced via the loudspeaker, other people can listen in to the conversation and can actively participate by speaking into the built-in sensitive microphone. These advantages will gain even greater significance in connection with the new communication technologies, such as video telephony, one of the services to be offered in the planned BISDN.

On the other hand, however, hands-free operation presents difficulties from the point of view of acoustics and transmission. Since all ambient noise is received and treated by the microphone in exactly the same way as the voice, the signal-to-noise ratio is lower than that with a handset which receives a well-defined direct microphone input. The same applies at the receive side, where the human ear hears both the useful signal and the interfering signal.

A signal received by the A-subscriber from the B-subscriber is reproduced as an acoustic signal by the loudspeaker of the hands-free facility. This acoustic signal propagates along the air path between the loudspeaker and the microphone and is received with a certain attenuation by the microphone, which sends it back to the B-subscriber. A closed loop is thus formed via the send path, the receive path, and the air path. If the gain of this loop is $V = 1/k$, where k is the coefficient of coupling between the loudspeaker and the microphone, a constant ringing tone is produced. This is extremely irritating, and measures must be taken to avoid it.

The prior art hands-free facility therefore includes a voice control system by which the gain in both transmission paths is controlled as a function of the voice level. An increase in gain in the send path causes a corresponding decrease in gain in the receive path, and vice versa. An optimum value for the voice-controlled swing can be estimated as a function of the particular operation conditions.

DISCLOSURE OF INVENTION

The object of the present invention is to provide a circuit arrangement for controlling the volume range of voice signals which utilizes the greatest possible loop gain without reducing the gain in the receive path.

According to the invention, this object is attained by a circuit arrangement wherein the microphone is followed by a controllable compandor (52) in which the signal voltages supplied by the microphone
A. are attenuated to a uniform signal level if they lie above a predetermined value,
B. are amplified if they lie below the predetermined value, and
C. are imparted maximum gain if they have the predetermined value.

The main advantage of the adaptive volume range control made possible by the invention lies in the fact that "duplex operation", which is usual in normal telephone communications, is preserved, i.e., that one party does not suppress the other. In addition, high-quality broadband and stereophonic hands-free operation can be achieved with the invention. A greater signal-to-noise ratio than usual is attainable with a simple and, thus, low-cost circuit. If the user is in a room with high ambient noise, he will naturally adapt to this situation by by increasing the volume of the reproduced sound and by speaking louder, which will be compensated for by the circuit, so that the transmitted ambient noise will be reduced. Also, constant ringing is reliably avoided.

Further advantageous aspects of the invention are apparent from the subclaims.

BRIEF DESCRIPTION OF DRAWINGS

Embodiments of the invention will now be explained with reference to the accompanying drawings, in which.

BEST MODE FOR CARRYING OUT THE INVENTION

Figure 1:
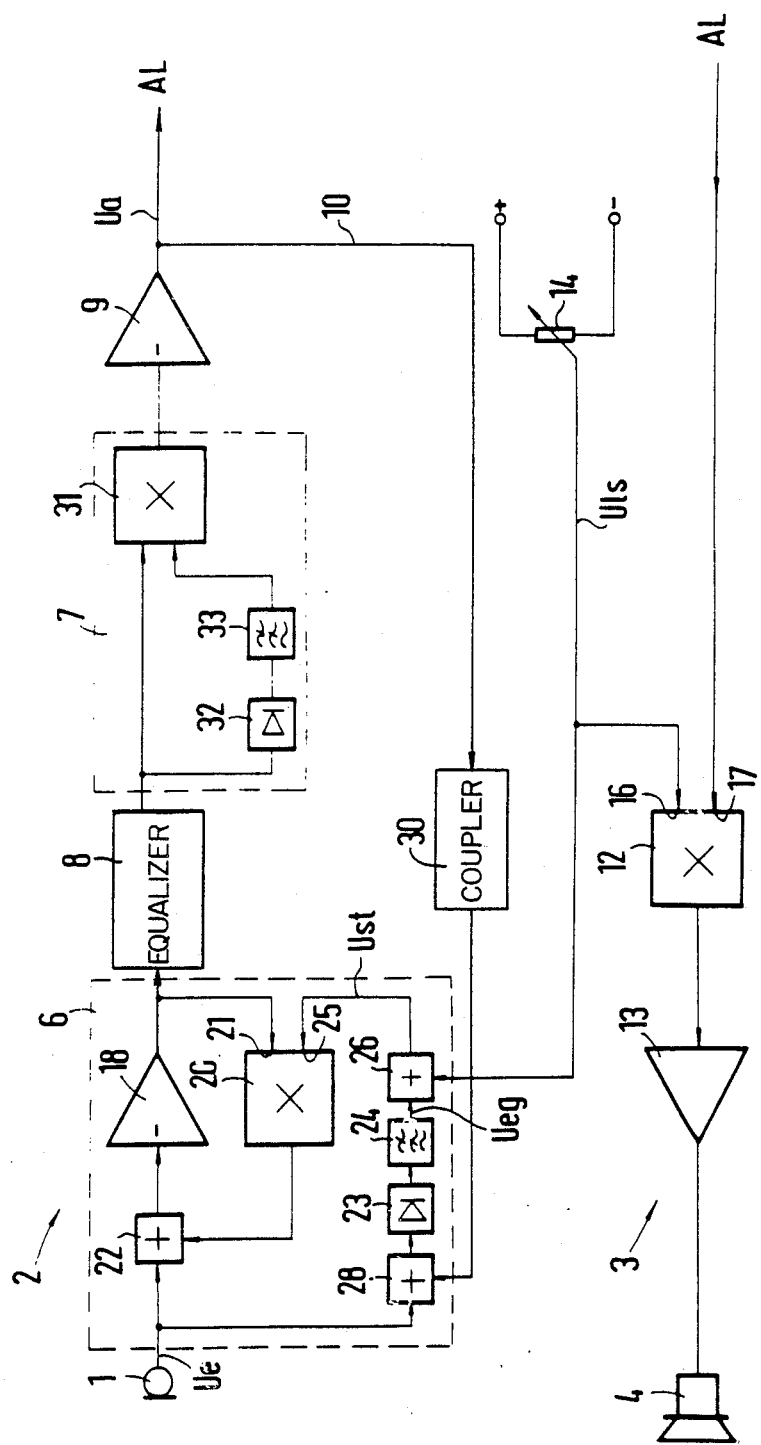
FIG. 1 shows a circuit arrangement according to the invention for controlling the volume range of voice signals.

A hands-free telephone has a microphone 1, which is connected to a subscriber line AL (not shown) via a send path 2 (FIG. 1). The subscriber line AL is, in turn, connected to a loudspeaker 4 via a receive path 3. For two-wire transmission, the send path 2 and the receive path 3 must be connected to the subscriber line AL in the conventional manner via a hybrid with a balancing network; for four-wire transmission, they can be connected directly to the respective pair of wires of the subscriber line AL.

The send path 2 contains a controllable compressor 6, an expander 7, an equalizer 8 between the compressor 6 and the expander 7, and an inverter 9. Details of the compressor 6 and the expander 7 will be explained below. The inverter 9 is implemented with an operational amplifier (e.g., type LS 404 of SGS-ATES, LM 324 of National Semiconductors (henceforth abbreviated NS), or the corresponding device of VALVO).

The output of the send path 2 is fed back to the compressor 6 over a line 10 containing a coupling stage 30. The receive path 3 contains a multiplier 12 followed by an amplifier 13, whose output is connected to the loudspeaker 4. The multiplier 12 is implemented with the component LM 13 600 of NS, TDA 4292 of Siemens, or TCA 730 or NE 572 of VALVO.

By means of a volume control 14, the user can vary the loudness of the sound reproduced by the loudspeaker 4. To this end, the output of the volume control 14 is applied to the control input 16 of the multiplier 12, where it causes the desired change in the amplitude or level of the signal applied to the signal input 17 of the multiplier 12. The output of the multiplier 12 is amplified in the amplifier 13 and fed to the loudspeaker 9.

The compressor 6 contains an inverting amplifier 18 and a multiplier 20 in the feedback loop of the amplifier 18; the latter and the multiplier 20 can also be regarded as a variable-gain amplifier. The output of the amplifier 18 is coupled to the signal input 21 of the multiplier 20. The inverting amplifier 18, too, is implemented with an operational amplifier (cf. inverter 9), and the multiplier 20 with the component NE 572 of VALVO or LM 13 600 of NS.

The output of the microphone 1 is the input signal Ue for the compressor 6, which is applied through an adder 22 to the input of the amplifier 18 and through a rectifier 23 and a low-pass filter 24 to a control input 25 of the multiplier 20. The rectified and smoothed signal corresponds to the arithmetic mean of the input voltage. Based on this mean, the feedback factor and, thus, the gain of the amplifier 18 are determined. With increasing volume at the microphone 1 and, thus, increasing amplitude of the microphone signal, the feedback is increased, so that the gain is reduced. This gives the compression in the compressor 6. For a graphic depiction of the action of the compressor 6 in the circuit arrangement according to the invention, see also FIG. 2.

Connected between the low-pass filter 24 and the control input 25 of the multiplier 20 is an adder 26, through which the output of the volume control 14 is applied to the control input 25. The value of the signal from the volume control determines the point at which the compression sets in. This set point is varied so that the resulting loop gain k is preserved. To this end, the gain of the multiplier 12 is varied via the control input 16. The signal levels lying in the vicinity of the set point—they are equal to the lowest voice level—are imparted the greatest gain, while larger signals are brought to a uniform amplitude by the compression. Above the set point of the compressor 6, the control signal Ust applied to the control input 25 is determined by the rectified microphone signal Ueg; below the set point, the influence of the volume control signal Uls prevails. If no further steps are taken, the transition between the range of expansion and the range of compression is gradual.

In a simpler embodiment, the volume control 14 may be replaced by a fixed resistor, which determines both volume and the compression set point.

By feeding the output Ua of the send path of the hands-free facility back to the compressor 6, the transition from the expansion range to the compression range is made narrower and sharper. The line 10, connected to the output of the inverter 9, is therefore connected to an additional adder 28, which precedes the rectifier 23. The output signal Ua is thus rectified and smoothed before being applied to the signal input 25.

The line 10 may contain a coupling stage 30. If linear coupling is to be achieved, the copuling stage 30 will be constituted by a resistor, for example. If the coupling stage is implemented with a component having a curved, preferably exponential, characteristic, a sharp transition will be obtained between the expansion range and the compression range.

Figure 3:
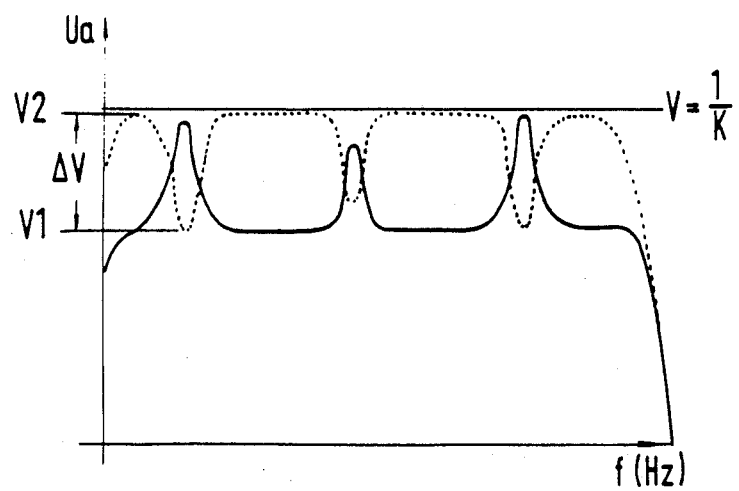
FIG. 3 is a diagram serving to explain the operation of the equalizer in the circuit arrangement of FIG. 1.

The output of the compressor 6 is fed to the equalizer 8, which consists of a system of band-elimination filters and in which the resonances of the electroacoustic transducer systems are suppressed. In FIG. 3, the unfiltered signal is shown by a solid line, and the corresponding passband curve of the equalizer 8 by a dotted line. As the system resonances are filtered out, the amplification of the useful signal can be increased from V1 to V2. ΔV is the maximum possible increase in amplification. Since distortions caused by the resonances are suppressed, the intelligibility of the voice signal is improved considerably. The design of the band-elimination filters depends on the characteristics of the electroacoustic transducers used, the location of the terminal, and the distance between the microphone and the loudspeaker.

The output of the equalizer 8 is fed to the expander 7, which contains a multiplier 31, a rectifier 32, and a low-pass filter 33. The equalizer output signal is applied directly to a first input (signal input) of the multiplier 31 and through the rectifier 32 and the low-pass filter 33 to a second input (control input) of the multiplier 31. By this multiplication of the input signal by the corresponding DC value of this signal, input-signal changes are squared in the expander. For the useful signals brought to a uniform amplitude in the compressor 6, the expander 7 has a preset gain, which represents the maximum gain of the expander. For signals whose amplitude lies below the point at which compression sets in, the gain decreases in proportion to the decrease in input voltage, i.e., voltages which are smaller than the useful signal are greatly reduced by the gain reduction. An input-level reduction causes a quadratically greater output-level reduction: $Ua2=Ua1\times(Ue2/Ue1)^2$, where Ue1 and Ue2 are first and second input-voltage levels, and Ua1 and Ua2 are first and second output-voltage levels.

Figure 2:
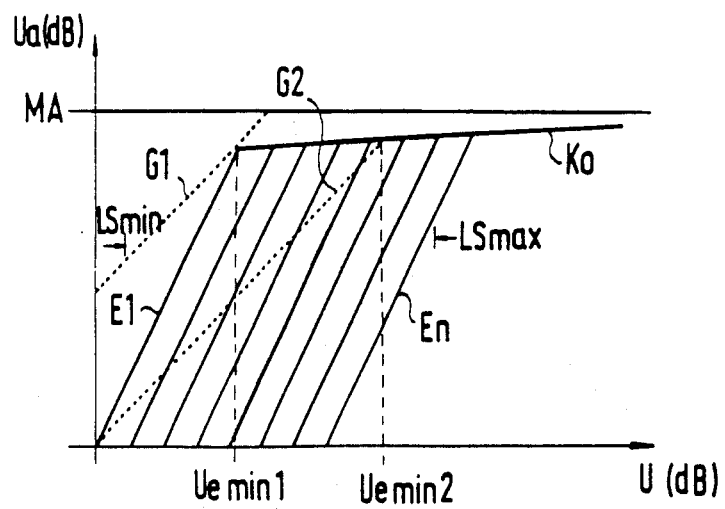
FIG. 2 is a diagram serving to explain the operation of the circuit arrangement of FIG. 1.

The advantages of the adaptive volume-range control of the voice signals are illustrated by the diagram of FIG. 2, in which the output voltage Ua is plotted versus the input voltage Ue, both measured in dB. The principle is shown for a fixed-gain hands-free facility by dotted lines, and for the hands-free facility according to the invention by solid lines. At a low voice level—straight line G1—, a high sensitivity can be set. In a hands-free facility with level-independent fixed gain, however, the overload level is reached very quickly, and interference signals are amplified together with the voice signals.

In the hands-free facility according to the invention, the input signals, i.e., the microphone signals, which lie below the set point of the compressor are largely suppressed. This range is illustrated by straight lines E1 to En. The set point of the compression and, thus, the position of the respective straight line for the expansion depend on the position of the volume control 14. The minimum possible volume setting is indicated by an arrow LSmin, and the maximum possible volume setting by an arrow LSmax. To signals lying in this range, the expander imparts a variable gain which decreases with decreasing signal amplitude, so that interference signals are largely suppressed. Just below its set point, the gain of the compressor has a fixed maximum value. Input signals lying above the set point of the compressor are brought to a nearly constant output voltage—straight line Ko—and, thus, give an essentially constant loudness of the reproduced sound at the B-subscriber, with the gain of the expander assuming a fixed maximum value.

Figuratively speaking, this has the same effect for the B-subscriber as if several persons using the hands-free facility of the A-subscriber were talking at the same distance from their terminal and with the same loudness, while noise sources appear to be far away from the terminal. In addition, echoes during the call are suppressed.

To process stereophonic signals, a hands-free facility or any other communication equipment for the transmission of voice or sound signals—such as a loudspeaker system with feedback path—must be provided with two channels, i.e., the subcircuits described must be duplicated.

Figure 4:
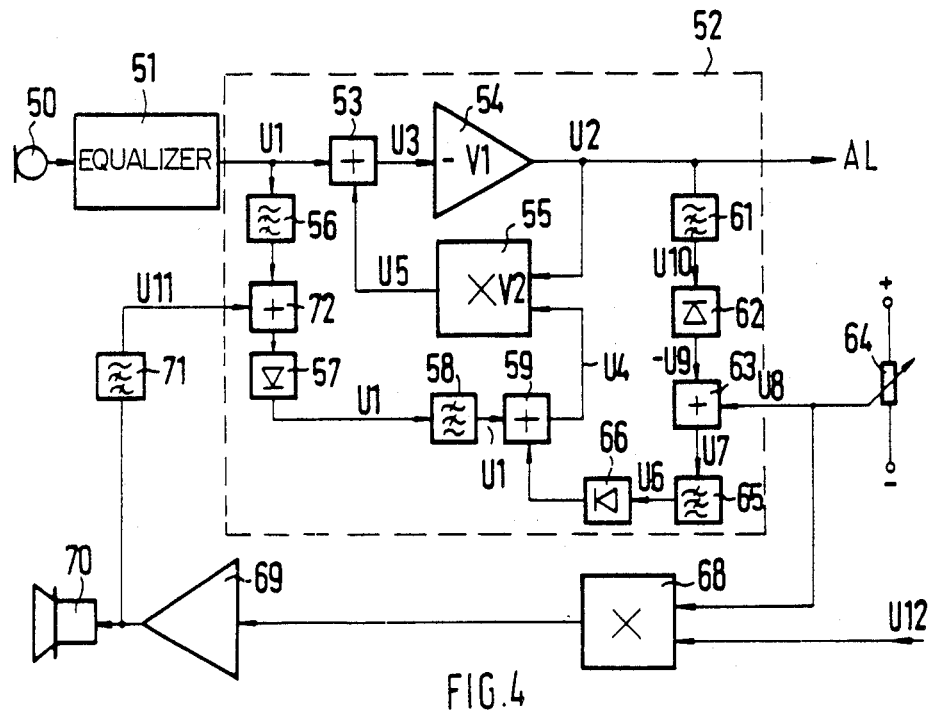
FIG. 4 shows a second embodiment of a circuit arrangement according to the invention.

The adaptive volume range control circuit shown in FIG. 4 has the advantageous characteristics of the circuit arrangement of FIG. 1 but requires fewer components because the need for one of the multipliers is eliminated. The signal voltage provided by the microphone 50 is applied to an equalizer 51, in which the above-mentioned system resonances are suppressed. From the equalizer 51, the filtered microphone or input voltage U1 is applied to a compandor 52, which replaces the compressor 6 and the expander 7 of the circuit of FIG. 1. An adder 53, an operational amplifier 54 (implemented like inverter 9), a multiplier 55 (cf. multiplier 20), a high-pass filter 56, a rectifier 57, and a low-pass filter 58 form a conventional compressor, which operates as follows.

The input voltage U1 passes through the adder 53 and is applied to the operational amplifier 54, whose output U2 is fed back to the adder 53 via the multiplier 55.

The input voltage U1 also passes through the high-pass filter 56, the rectifier 57, and the low-pass filter 58 and is applied as an average voltage value U4 to the second input (control input) of the multiplier 55. If no further voltage is applied through an adder 59, the average value U4 is equal to the average of the input voltage U1.

The multiplier 55 multiplies the average voltage value U4 by the time-varying output voltage U2. An increase in the input voltage U1 causes a proportional increase in the gain product U4·V2. As a result, the feedback voltage U5 applied to the adder 53 increases by the same amount as the input voltage U1. The time-varying input and output voltages U3, U2 of the amplifier 54 remain unchanged, however. This results in the compression of the voice signals in the compandor 52.

In addition, the set point of the compression is determined, and expansion of the voice signals is caused, by the following subcircuits: a high-pass filter 61, a full-wave rectifier 62, an adder 63, a volume control 64, a low-pass filter 65, and a diode 66 (e.g., type 1N 4148 or 1N 4151 of ITT).

The input voltage U1 at which compression is to set in depends on the magnitude of a control voltage U6, which is applied to the input of the multiplier 55 via the diode 66 and the adder 59. The average control voltage U6 determines the gain product U4·V2 of the multiplier 55 if the average of the input voltage U1 is less than U6.

If the gain product is determined only by a DC voltage U8 preset by the volume control 64, the result is a constant amplification of the input signal U1, whose dynamic variations are proportionally transmitted to the output signal U2.

If the input voltage U1 exceeds the control voltage U6, the diode 66 turns off, so that the gain product of the multiplier 55 is dependent on the input signal U1 again, i.e., compression takes place. This behavior is illustrated by a curve a in FIG. 8.

The control voltage U6 is composed of a DC voltage which depends on the position of the volume control 64, and a rectified AC voltage U9 derived from the time-varying output voltage U2. To this end, the output voltage U2 is freed from DC voltage components by the high-pass filter 61 and rectified by the full-wave rectifier 62. The latter delivers a negative voltage −U9, whose magnitude is dependent on the output signal U2.

In the adder 63, U8 and −U9 are added together. U6 thus represents a control voltage which decreases with increasing output voltage U2. Throughout the range in which the input voltage U1 is smaller than U6, a decrease in the control voltage U6=U4 causes a decrease in the feedback voltage U5 and, thus, an increase in the output voltage U2.

Figure 8:
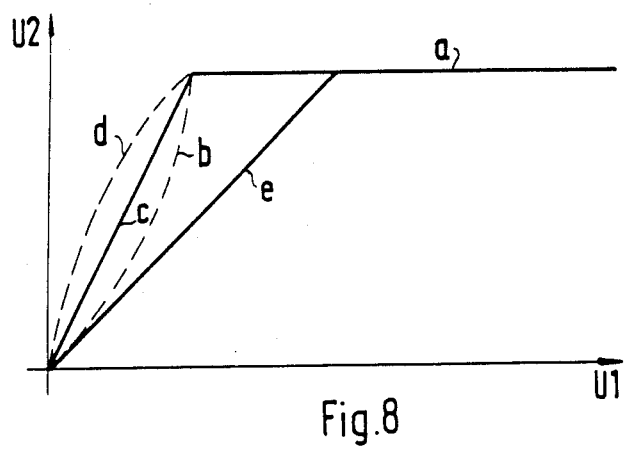
FIG. 8 is a diagram serving to explain the circuit arrangements of FIGS. 4 to 7.

The average of the DC voltage U7 provided by the adder 63 is taken by the low-pass filter 65. The low-pass filter 65 determines the control time constant for the expansion. In the diagram of FIG. 8, in which the output voltage U2 is plotted versus the input voltage U1, curve b shows that the expansion increase with increasing input voltage, since the effect of the rectified AC voltage −U9 on the control voltage increases with increasing input voltage U1. This behavior can be counteracted by using a full-wave rectifier 62 with a logarithmic characteristic.

Based on the characteristic of the rectifier 62, the kind of the increase in expansion can be determined. Curves b and d in FIG. 8 are examples of this. With the aid of the gain of the active rectifier 62, the slope of the expansion can be determined (FIG. 8, curves c and e).

The DC voltage U8 provided by the volume control 64 is also applied to the input of a multiplier 68 (cf. multiplier 12) and thus determines the reproduced volume in the receive path of the circuit arrangement. The signal U12 received from the distant party over the subscriber line is applied to the second input of the multiplier 68. The output of the multiplier 68 is connected via an amplifier 69 to a loudspeaker 70.

Figure 9:
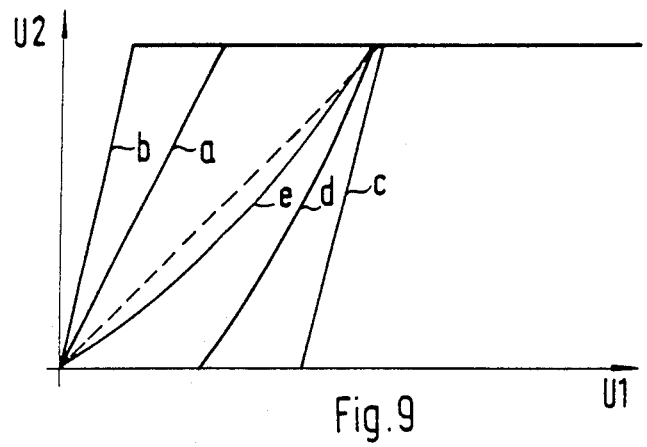
FIG. 9 is another diagram serving to explain the circuit arrangements of FIGS. 4 to 7.

If the volume is increased at the volume control 64, so that the amplification of the received signal U12 is increased, the compression set point will be shifted. This is illustrated in FIG. 9 by the distance between curve c and curve b. The shift prevents the loop gain from exceeding a maximum permissible value, thus avoiding feedback.

Figure 11:
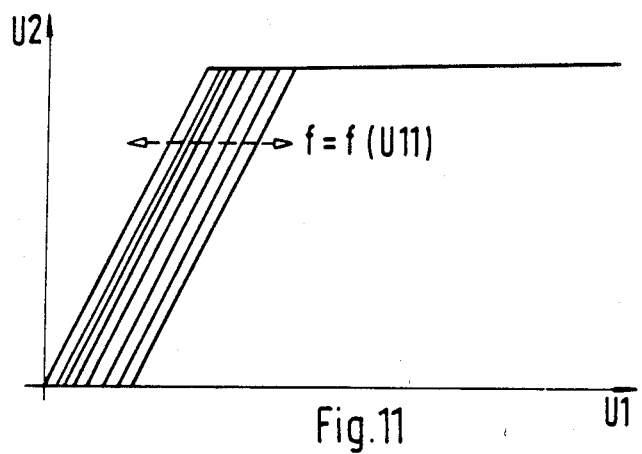
FIG. 11 is another diagram serving to explain the operation of the circuit arrangement of FIG. 4.

If a quantity derived from the received voltage U12 were superimposed on the voltage U8, the compression inset point could be controlled in accordance with the dynamic variations of the received signal. In this manner, the risk of feedback would be futher reduced and the loudness of the reproduced sound could be increased by an amount equal to the shift of the characteristics; this shift is indicated in FIG. 11. The same effect can be achieved by adding the received voltage to the input voltage U1, as is done in the circuit arrangement of FIG. 4, where the voltage provided by the amplifier 69 is passed through a high-pass filter and applied as a derived received voltage U11 to an adder 72 connected between the high-pass filter 56 and the rectifier 57.

The control time constants for expansion and compression can be determined independently of each other with the aid of the low-pass filters 58 and 65. In the circuit arrangement of FIG. 5, the control time constant is the same for expansion and compression; it is determined by only one low-pass filter 74, which acts as an integrator. To this end, the rectified AC voltages U1 and U7 are added together in the adder 75 before being integrated. The remainder of the circuit of FIG. 5 and the operation of this circuit largely correspond to the circuit of FIG. 4 and, therefore, will not be explained again.

Figure 5:
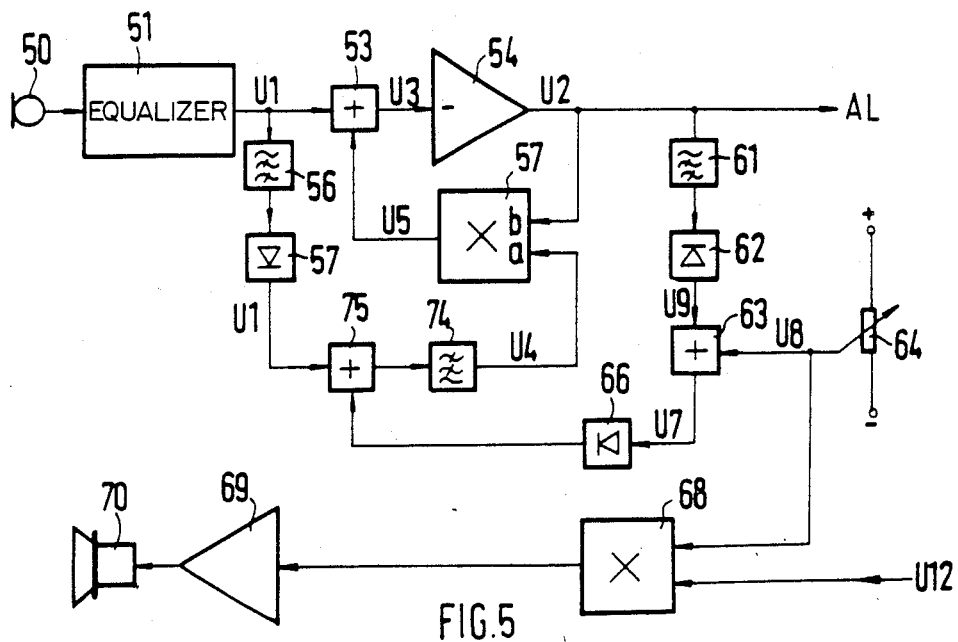
FIG. 5 shows a third embodiment of a circuit arrangement according to the invention.
Figure 6:
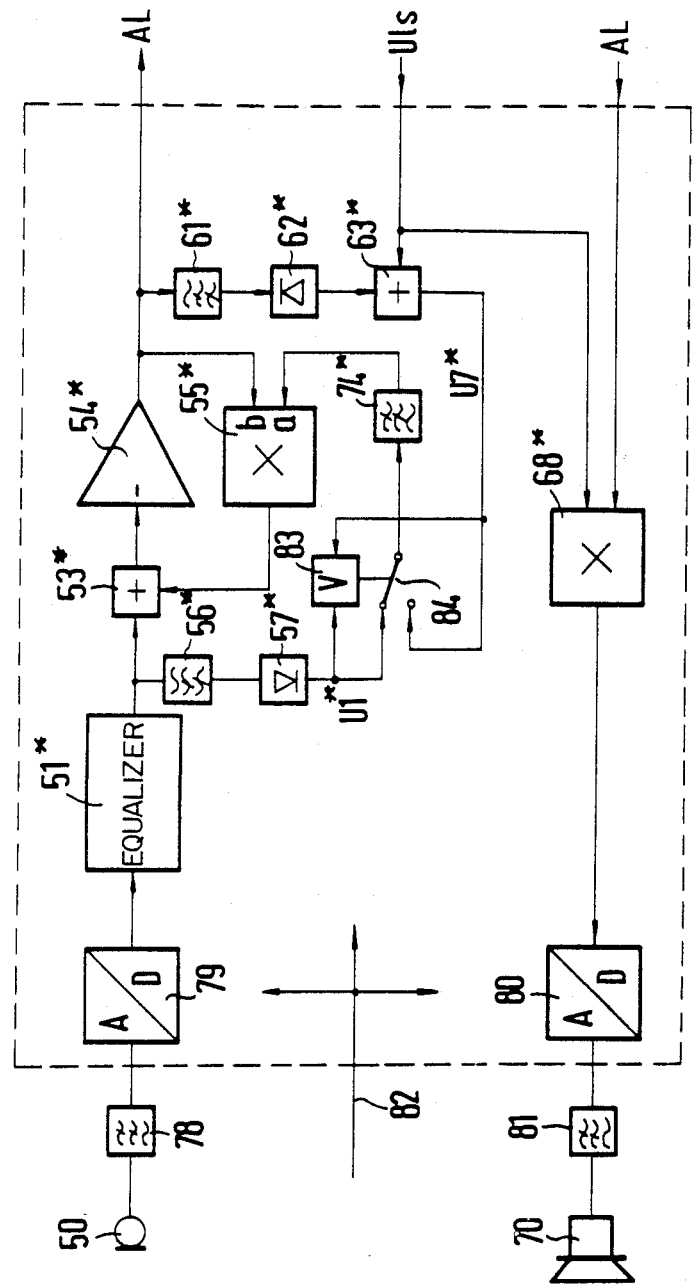
FIG. 6 shows a fourth embodiment of a circuit arrangement according to the invention, with digital signal processing.

In the circuit arrangement shown in FIG. 6, the voice signals are processed and transmitted in digital form. The subcircuits frmaed by the dashed line have similar functions as the corresponding subcircuits of FIG. 4 or 5 but differ from the latter in that they are designed to process digitized signals. The digital subcircuits are designated by the same reference characters as in FIGS. 4 and 5 and additionally marked with an asterisk.

Since the loudspeaker and microphone signals are still analog signals, they must first be converted, respectively, from and into time-discrete digital sample values. This requires a few additional components. The microphone 50 is connected via an anti-aliasing filter 78, which suppresses frequencies higher than half the sampling frequency, to an analog-to-digital converter 79. In the receive path, the signals received over the subscriber line AL ae converted into an analog signal in a digital-to-analog converter 80, and a low-pass filter 81 cuts off any residual harmonics. To process the signals, all digital components need clock signals. This is indicated in the drawing by a clock line 82. The instantaneous values of the voltages U1* and U7*, which are delivered by the rectifier 57* and the adder 63*, respectively, are compared in a comparator 83, which controls a switch 84 in such a way that the voltage having the greater value is applied to the integrator 74*. This corresponds to the function of the diode 66 in FIG. 5 and determines the transition from expansion to compression. Otherwise, the operation of the circuit is as described with the aid of the previous embodiments.

Figure 7:
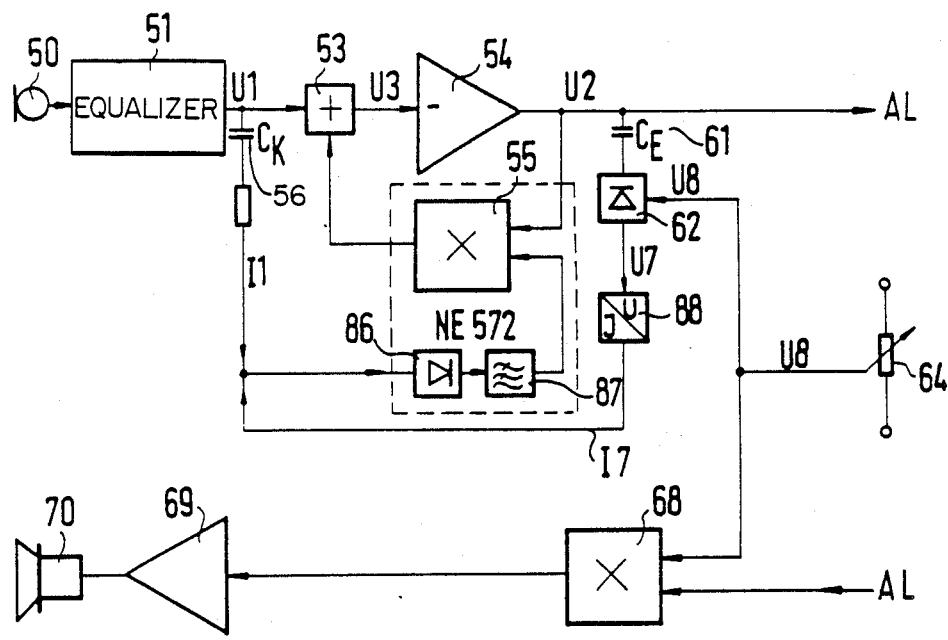
FIG. 7 shows a fifth embodiment of a circuit arrangement according to the invention.

The operation of the circuit of FIG. 7, too, corresponds to that of the above-described embodiments, but this circuit is implemented with the commercially available compandor unit NE 572 of VALVO. Since this unit includes a rectifier 86 with a current input, and the output of this rectifier, which is connected to an integrator 87, is inaccessible, the superposed AC voltage U7 is converted by a voltage-to-current converter 88 into a control current I7, which is added to the input current I1 prior to the rectification. The voltage-to-current converter 88 operates as an exponentiator according to the following function:

$$I7 = EXP(U7/UT)$$

Figure 10:
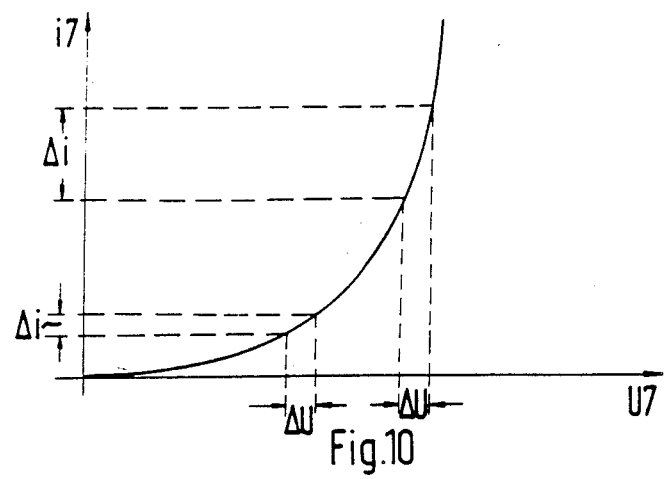
FIG. 10 is a diagram serving to explain the operation of the voltage-to-current converter used in the circuit arrangement of FIG. 7.

This functional relationship $I7 = f(U7)$ is shown in FIG. 10. A high DC voltage U8 causes a high DC voltage component U7 and the latter shifts the control current I7 into the steep portion of the curve, in which small changes of U7, which are caused by the superposed AC voltage component U2, result in a steep expander function. As the DC voltage decreases, the expansion is reduced, as is apparent from curves c, d and e in FIG. 9.

The gain of the active rectifier 62 determines the slope of the expansion curve. The DC voltage U8 determines the operating point of the rectifier 62.

With the circuit arrangements according to the invention, interference signals are attenuated and useful signals are brought to a constant transmit level. Acoustic feedback is prevented in a simple and effective manner by shifting the compression set point. Reverberation, which frequently occurs during hands-free operation, is greatly reduced. The circuit arrangements are therefore suitable both for use in hands-free telephones and for other kinds of speech circuits for, e.g., public address systems in lecture rooms or the reception of useful acoustic signals surrounded by disturbing noise.

If the volume of the reproduced sound is adjusted manually, it may happen that the user sets a higher volume than necessary. In an office—with an ambient noise of, e.g., 50 dB(A)—, a user usually speaks with a moderate volume, i.e., about 60 dB(A). In that case, the volume of the sound received at the telephone terminal used should reach the same sound pressure, i.e., 60 dB(A).

If the volume of the reproduced sound is set too high, the compression set point—i.e., the state of maximum microphone sensitivity—may be shifted so far that the useful signals are no longer in the compression range, and the transmitted volume of low level syllables will be reduced, because they now fall within the expansion range.

Figure 12:
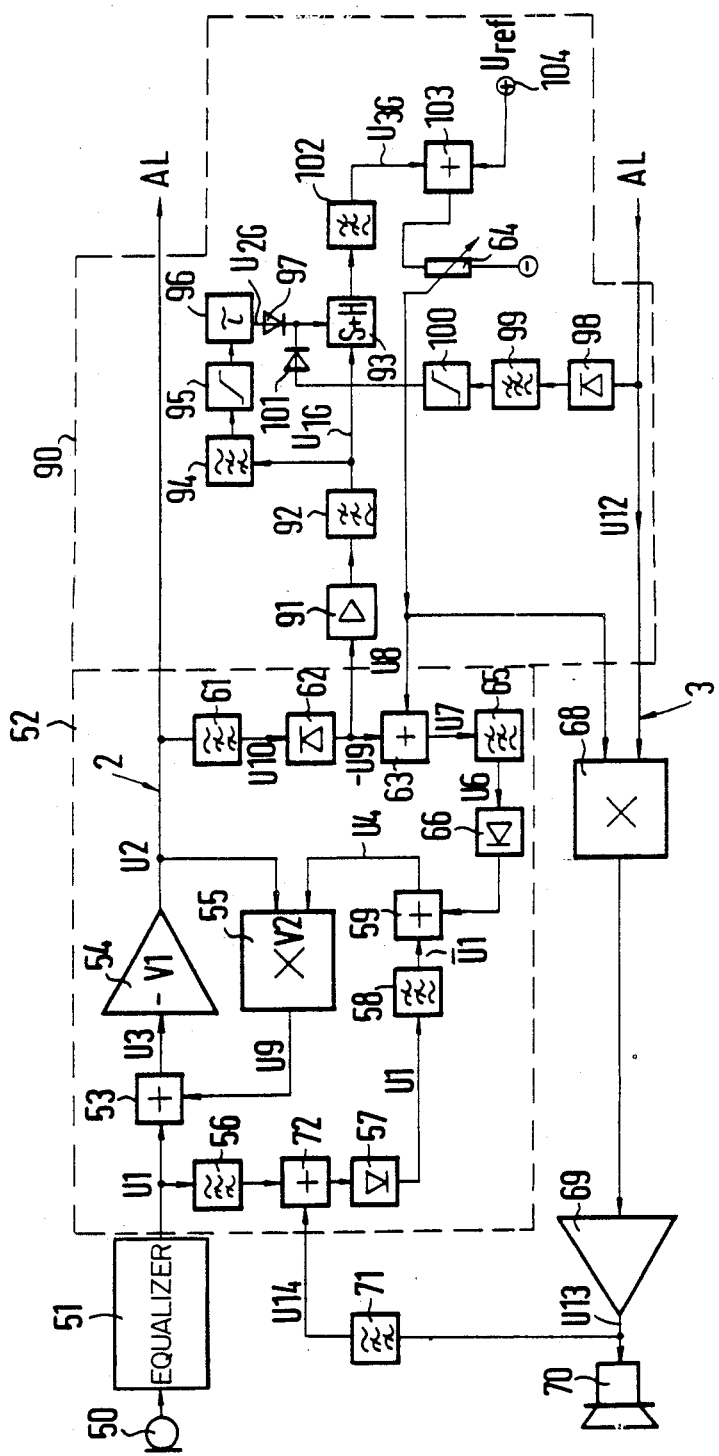
FIG. 12 shows a sixth embodiment of a circuit arrangement according to the invention.

The volume range control circuit shown in FIG. 12 automatically provides to the subscriber a maximum adjustable volume which is approximately equal to the loudness of his own voice. To this end, the predetermined value of the signal voltages, i.e., the compression set point, is made to vary by a control circuit as a function of the ambient noise.

Since at higher ambient noise levels—from, e.g., 60 to 70 dB(A)—the subscriber speaks more loudly—at about 70 to 80 dB(A)—, the compression set point can be changed in accordance with the increase in ambient noise—i.e., by 10 to 20 dB(A). In addition, the volume of the received sound can be increased by the same amount, i.e., by 10 to 20 dB. The volume of the received sound is thus adapted to the specific ambient conditions. The suppression of interference signals in the send path increases with increasing ambient noise. This results in an approximately constant signal-to-noise ratio, which is an essential advantage of this circuit arrangement.

The microphone 50 is connected via the send path 2 to the subscriber line AL (FIG. 12). The subscriber line is connected via the receive path 3 to the loudspeaker 70. The transmit path 2, the receive path 3, and the compandor 53 are identical in design to the embodiment of FIG. 4.

With the aid of the following subcircuits, the compression set point is determined and expansion of the voice signals is effected: the high-pass filter 61, the full-wave rectifier 62, the adder 63, the low-pass filter 65, the diode 66, and a control circuit 90 containing a volume control 64.

The input voltage U1 at which compression is to set in depends on the magnitude of the control voltage U6 applied through the diode 66 and the adder 59 to the input of the multiplier 55, as mentioned above. The averaged control voltage U6 determines the gain product U4·U1 of the multiplier 55 if the average of the input voltage U1 is smaller than U6.

If the gain product is determined only by a DC voltage U8 provided by the control circuit 90, a constant amplification is imparted to the input signal U1, whose dynamic variations are proportionally transmitted to the output signal U2.

When the input voltage U1 exceeds the control voltage U6, the diode 66 turns off, so that the gain product of the multiplier 55 is dependent on the input signal U1 again; thus, compression takes place.

The control voltage U6 is composed of the DC voltage U8, which is provided by the control circuit 90, and the rectified AC voltage U9, which is derived from the time-varying output voltage U2. To this end, the output voltage U2 is freed from DC voltage components by the high-pass filter 61 and rectified by the full-wave rectifier 62. The latter delivers the negative voltage $-U9$, whose magnitude is dependent on the output signal U2.

In the adder 63, U8 and $-U9$ are added together. U6 thus represents the control voltage, which, on the one hand, decreases with increasing output voltage U2 and, on the other hand, depends on the magnitude of the DC voltage U8 provided by the control circuit. Over the entire range in which the input voltage U1 is smaller than U6, a decrease in the control voltage U6=U4 causes a decrease in feedback voltage and, thus, an increase in the output voltage U2.

The low-pass filter 65 takes the average of the DC voltage U7 resulting from the addition. This low-pass filter 65 determines the control time constant for the expansion.

The DC voltage U8 provided by the control circuit 90 is also applied to the input of the multiplier 68 and, thus, determines the volume of the reproduced sound in the receive path 3 of the circuit arrangement. The signal U12 received from the distant subscriber over the subscriber line is applied to the second input of the multiplier 68. The output of the multiplier 68 is coupled to the amplifier 69, whose output provides an amplified received signal U13 to the loudspeaker 70. If the DC voltage U8 from the control circuit 90 is increased, thus increasing the amplification of the received signal U12, the compression set point will be shifted. This prevents the maximum permissible loop gain from being exceeded, so that feedback is avoided.

The compression set point is made to vary as a function of the dynamic variations of the received signal. In this manner, the risk of feedback is further reduced, and the volume of the reproduced sound can be increased by the same amount by which the compression inset point is shifted. This is achieved by adding the amplified received voltage U13 to the input voltage U1. To do this, the voltage U13 from the output of the amplifier 69 is passed through a high-pass filter 71 and applied as a derived received voltage U14 to the adder 72 between the high-pass filter 56 and the rectifier 57.

The control time constants for expansion and compression are determined independently of each other with the aid of the low-pass filters 58 and 65. The gain of the active rectifier 62 determines the slope of the expansion. The DC voltage U8 determines the operating point of the rectifier 62.

The manipulated variable for the control circuit 90 is the output signal $-U9$ of the rectifier 62, which determines the expansive action of the compandor 52 as explained above. This signal passes through an inverting amplifier 91 and an integrator 92 and is applied as a signal voltage U1G to the input of a sample-and-hold device 93.

Figure 15:
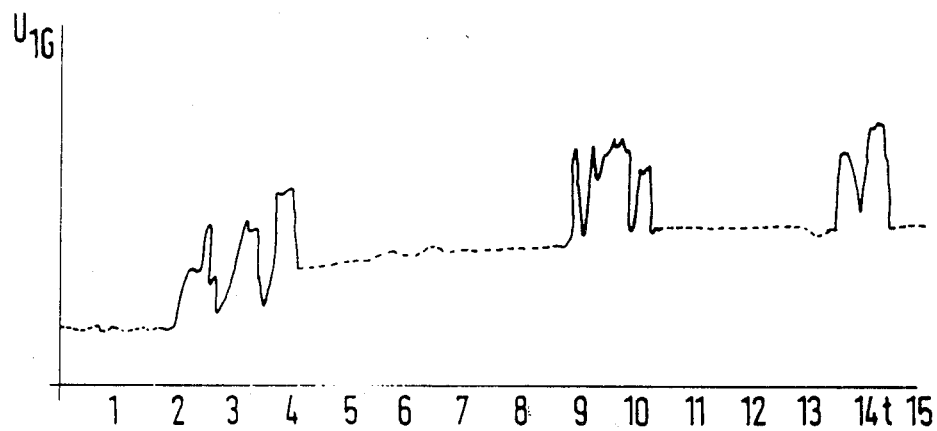
FIG. 15 is a schematic representation of the sound signals present in the environment of a circuit arrangement according to the invention.

FIG. 15 shows the waveform of the voltage U1G at the output of the integrator 92. The representation corresponds to a situation in which the ambient noise increases while a subscriber is speaking. The voice signals are shown as solid lines, and the ambient noise as dashed lines.

To prevent the voice signals from causing a shift of the characteristic in the compandor 52, a new value of the manipulated variable is taken into account in the control circuit only if the voltage U1G exhibits no wide dynamic variations as occur when a person is talking. To this end, the voltage U1G is applied through a differentiator 94 and a threshold circuit 95 to a timing element 96. In case of wide dynamic variations, a corresponding pulse at the output of the threshold circuit 95, which is lengthened in the timing element 96 and applied through a diode 97 to the control input of the sample-and-hold device 93, prevents the latter from receiving the signal voltage U1G as long as the subscriber is talking. Thus, the criterion for distinguishing unwanted noise in the environment of the terminal is the continuity of this noise; this continuity is not present in voice signals.

Since the received voice signals radiated by the loudspeaker 70 would have an undesired influence on the circuit arrangement, too, the received signal voltage U12 is applied through a rectifier 93, an integrator 99, a threshold circuit 100, and a diode 101 to the control input of the sample-and-hold device 93. The latter thus receives no new values of the signal voltage $U_{1G}$ as long as received voice signals are outputted. It is only during silent intervals that the signal voltage depending on the manipulated variable U9 is received and the changes are evaluated.

The output of the sample-and-hold device 93 passes through an integrator 102 and is applied as a signal U3G to an adder 103, from which it is applied to the volume control 64, with which the user can adjust the volume of the loudspeaker 70 manually. From the output of the volume control 64, the signal is applied to the compandor control input, which is connected to the adder 63. At a given setting of the volume control 64, the signal U3G controls the compandor 52, with the characteristic of the latter being influenced as a function of the ambient noise.

Figure 16:
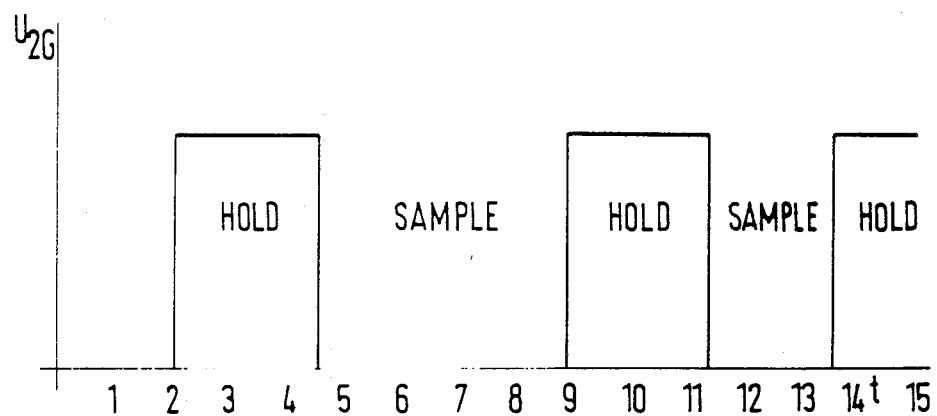
FIG. 16 is another diagram serving to explain the operation of the circuit arrangement according to the invention.

From FIG. 16 it can be seen that under control of the voltage U2G applied to its control input, the sample-and-hold device 93 samples during silent intervals and is in the hold condition during conversation.

Figure 17:
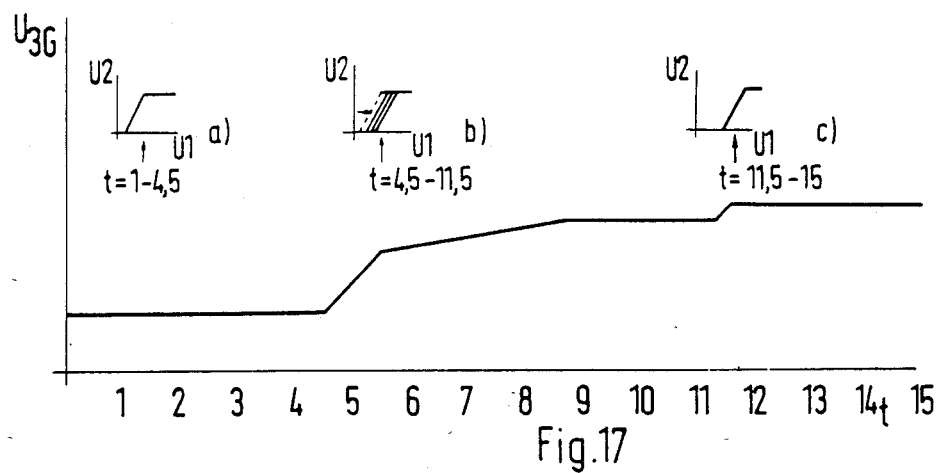
FIG. 17 is a further diagram serving to explain the operation of the circuit arrangement according to the invention.

The influence on the compandor characteristic will now be explained with the aid of FIG. 17, in which the control signal U3G is plotted as a function of time. Also shown, in the form of charts U2=f(U1), are the compandor characteristics resulting from three different values of U3G.

During the time t=1–4.5 s, the ambient noise is low, so that the signal U3G has a small value. Here, the compression of the voice signals sets in already at a relatively low speech level of the subscriber. In the charts included in the figure, the compression set point is obtained as the intersection of the steep expansion line and the gradually rising compression line. In FIG. 17(a), this set point is located at a small value of U1.

During the time t=4.5 to 11.5 s, the ambient noise and, hence, the level of U3G increases several times at different rates. Each of these increases results in a shift of the compression set point to the right, i.e., toward higher values of the microphone signal, as is indicated in FIG. 17(b) by an arrow.

During the time t=11.5 to 15 s, the ambient noise level is very high. The compression set point is shifted far to the right, i.e., compression sets in only at a relatively high speech level of the subscriber, FIG. 17(c).

Besides controlling the compandor 52, the signal U3G controls the multiplier 68, whereby the volume of the reproduced sound, is automatically adapted to the ambient noise.

In the adder 103, a reference voltage Uref from a reference-voltage source 104 is superimposed on the signal U3G. This basic setting determines the lowest possible maximum volume. By means of the volume control 64, the user can adjust the desired volume of the reproduced sound, while the respective maximum possible volume is determined by the control circuit 90.

If used in environments with approximately constant ambient noise—such as in dwellings, in the office, in an open-plan office, or in an exhibition hall—, the circuit arrangement explained with the aid of FIG. 12 permits very effective adaptive volume control.

Figure 13:
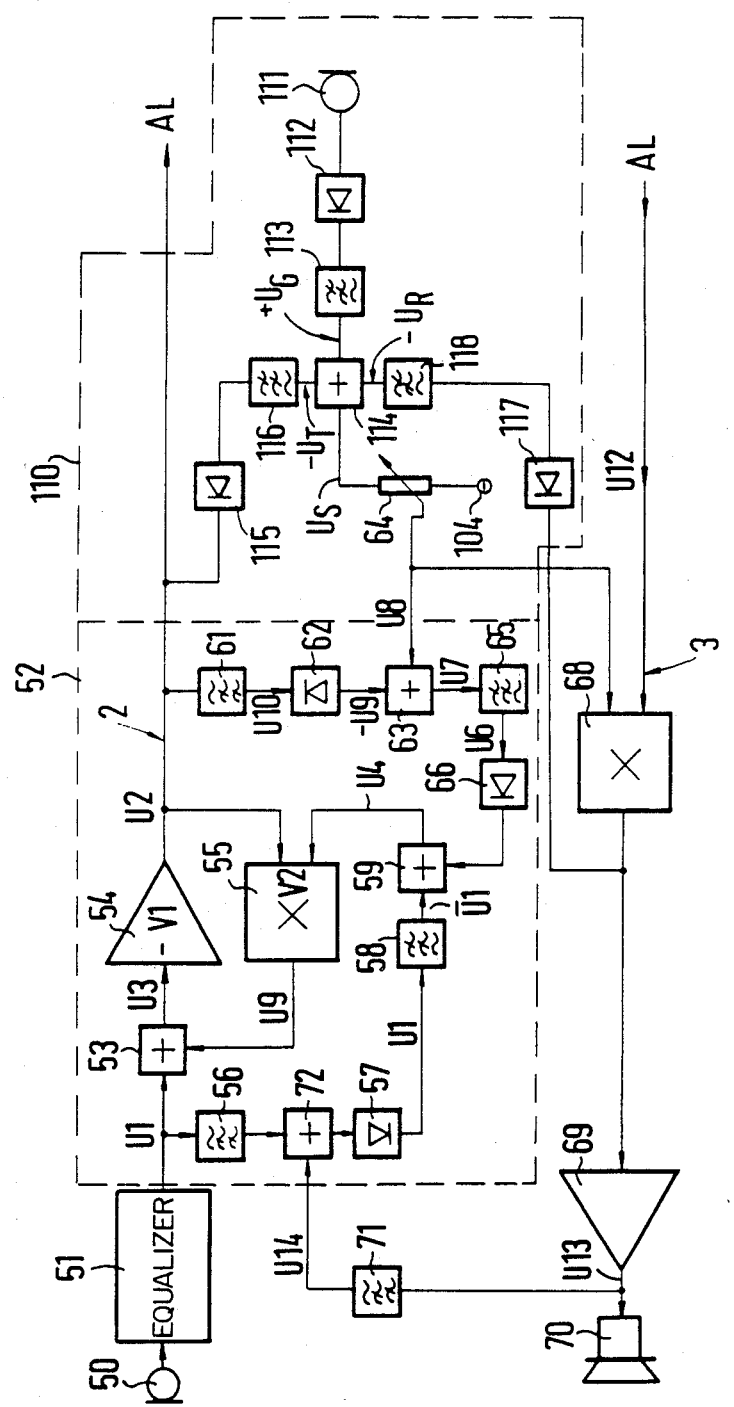
FIG. 13 shows a seventh embodiment of a circuit arrangement according to the invention.

In environments with widely varying noise levels—such as at airports or railway stations—, immediate adaptation to the ambient noise is appropriate. This can be accomplished by means of the circuit arrangement shown in FIG. 13. The manipulated variable for the control circuit 110 is provided by a measuring microphone 111, which is so positioned that mainly the ambient noise determines the measurement voltage level appearing at the output of a rectifier 112. The measurement voltage passes through a low-pass filter 113 and is applied as an integrated measurement voltage UG to an adder 114, in which the portions of the level increase produced by the talker and the loudspeaker are deducted. To this end, the output signal U2 is applied through an inverting rectifier 115 to a low-pass filter 116, whose output −UT is fed to one input of the adder 114, and the received signal U12 is applied from the output of the multiplier 68 through an inverting rectifier 117 to a low-pass filter 118, whose output −UR is fed to another input of the adder 114. The control signal at the output of the adder 114 is thus $$US = UG - UT - UR.$$

This control signal is applied through the volume control 64 to the control input of the compandor 52, i.e., to the adder 63. Here, too, a reference-voltage source may determine a basic setting which determines the lowest possible maximum volume.

The control voltage US continuously adapts itself to the ambient noise and varies the compression inset point and the volume of the reproduced sound as a function of the ambient noise.

Figure 14:
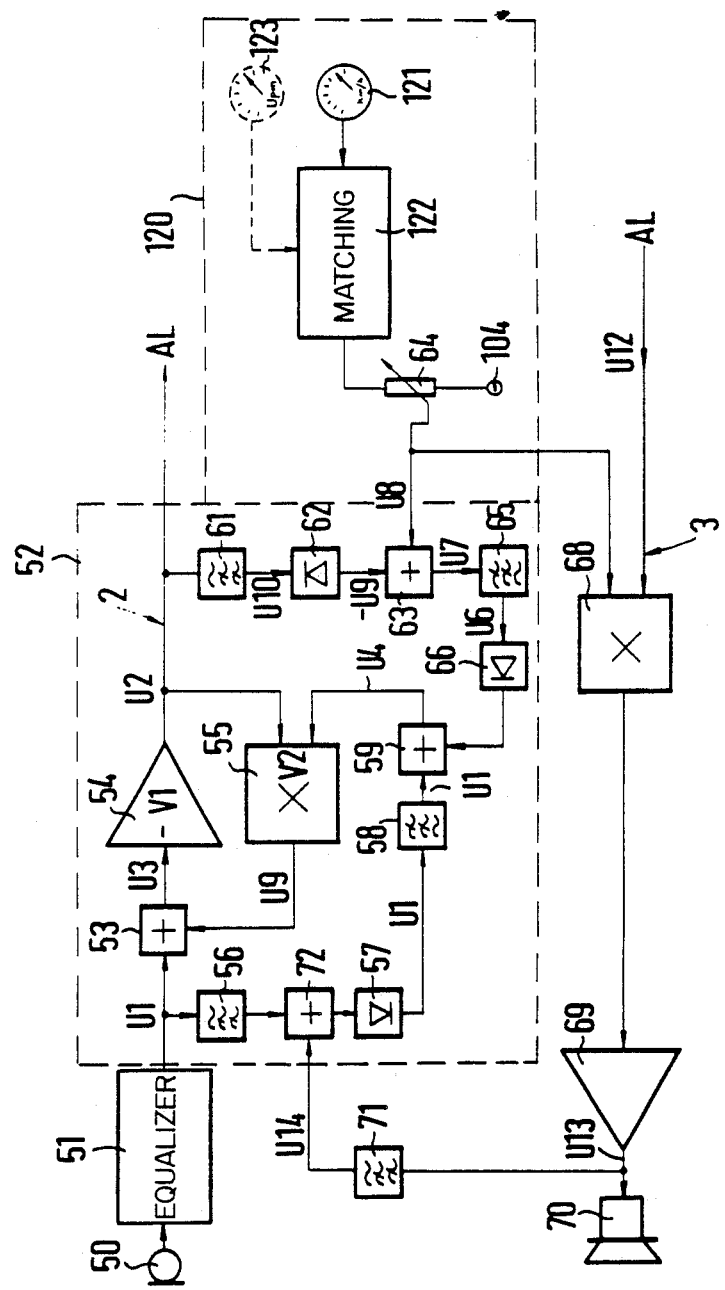
FIG. 14 shows an eighth embodiment of a circuit arrangement according to the invention.

The control circuit of FIG. 14 is suitable for telephone terminals used in automobiles. The noise in an automobile depends nearly exclusively on the speed of travel. The manipulated variable for the control circuit 120 is taken directly from the speedometer 121 of the automobile. The output of the speedometer 121 is fed to a matching circuit 122, from which it passes through the volume control 64 and is applied as a control signal U8 to the adder 63 of the compandor 52. It is also applied to the multiplier 68, so that it also influences the level of the received signal U12. In addition to the speedometer 121, a revolution counter 123 may deliver the actuating signal for the control circuit 120. This is particularly appropriate in automobiles in which the engine noise contributes substantially to the noise level.

The circuit arrangement of FIG. 14 is inexpensive but highly reliable. It also increases safety because the user need not make any volume corrections while driving.

We claim:

1. A circuit arrangement for controlling the dynamic range of voice signals in a communication terminal, comprising
    a transmission channel,
    a user microphone coupled to the transmission channel for supplying signal voltages in response to a voice input, the connection between the user microphone and the transmission channel defining a send path,
    a compandor in said send path between said user microphone and said transmission channel which attenuates the signal voltages above a predetermined value and amplifies the signal voltages below the predetermined value with the gain of the compander being equal to a maximum gain when said signal voltages are just below said predetermined value,
    a loudspeaker coupled to the transmission channel, the connection between the loudspeaker and the transmission channel defining a receive path,
    volume control means for varying the loudness of the loudspeaker and
    means responsive to said volume control means for lowering said predetermined value when the loudness of the loudspeaker is increased.

2. A circuit arrangement as claimed in claim 1, wherein
    a compressor portion of the compandor comprises
        an operational amplifier having a feedback loop and a multiplier inserted in the feedback loop of the operational amplifier and having a control input for a control signal, and means for combining a first DC voltage representing the level of the output from the user microphone, a second DC voltage representing the volume control setting and a third DC voltage representing the signal level of the compander output, to form said control signal.

3. A circuit arrangement as claimed in claim 2, wherein said first DC voltage is the output signal from the compandor
freed from its DC voltage components in a high-pass filter and rectified in a full-wave rectifier, and said first DC voltage is superimposed on said second DC voltage
in an adder.

4. A circuit arrangement as claimed in claim 3, wherein the DC voltage signal delivered by the adder is applied to a low-pass filter before being combined with said thrid DC voltage signal.

5. A circuit arrangement as claimed in claim 1, wherein
the compandor consists of a compressor portion followed by an expander portion,
those signal voltages from the user microphone which lie above the predetermined value are attenuated in the compressor portion by changing the gain thereof to produce a signal having a more uniform level,
the thus-compressed signal from the compressor portion is then processed in the expander portion by amplifying the signal voltages lying below the predetermined value with a gain which decreases with decreasing signal level, and
the gain of the compressor portion assumes its maximum value for signal voltages having the predetermined value.

6. A circuit arrangement as claimed in claim 5, wherein the compressor portion comprises
means for generating a first DC voltage representing the level of the output signal from the user microphone, an operational amplifier having a feedback loop and
a multiplier inserted in the feedback loop and having control input to which is applied a control signal derived from said first DC voltage.

7. A circuit arrangement as claimed in claim 6, further comprising means for combining the output of the send path with said first DC voltage during the derivation of said control signal.

8. A circuit arrangement as claimed in claim 7, wherein the combining means comprises a coupling stage having an element with an exponential characteristic.

9. A circuit arrangement as claimed in claim 5, wherein an equalizer suppressing the resonance ranges of the user microphone is connected in said send path ahead of said expander portion.

10. A circuit arrangement as claimed in claim 1 further comprising control means for adaptively setting the loudspeaker volume and the predetermined value as a function of the ambient noise.

11. A circuit arrangement as claimed in claim 10, wherein the signal-to-noise ratio of the voice signal provided at the output of the send path is maintained constant by the control means.

12. A circuit arrangement as claimed in claim 10, wherein the control means is responsive to a rectified AC voltage derived from the output voltage of the send path.

13. A circuit arrangement as claimed in claim 12, wherein the control means comprises
a sample-and-hold device to which the rectified AC voltage is applied through a first integrator and whose output is applied through a second integrator to a control input of the compandor.

14. A circuit arrangement as claimed in claim 13, wherein the control means further comprises
a first blocking circuit which prevents the integrated AC voltage from being received by the sample-and-hold device while the user is talking.

15. A circuit arrangement as claimed in claim 13, wherein said control means further comprises
a second blocking circuit which prevents the integrated AC voltage from being received by the sample-and-hold device during the reproduction of received voice signals via a loudspeaker coupled to said transmission channel.

16. A circuit arrangement as claimed in claim 15, wherein a reference voltage determining the lowest maximum volume at the loudspeaker is added to the integrated output signal from the sample-and-hold device.

17. A circuit arrangement as claimed in claim 10, wherein said control means is responsive to an ambient noise signal from a measuring microphone.

18. A circuit arrangement as claimed in claim 17, wherein the voice signal produced by the user microphone and the voice signal output to a user loudspeaker are subtracted from the signal output by the measuring microphone to form a signal representative of ambient noise.

19. A circuit arrangement as claimed in claim 10, wherein said control means is further responsive to a signal representative of the operating state of a motor vehicle.

* * * * *

UNITED STATES PATENT AND TRADEMARK OFFICE
CERTIFICATE OF CORRECTION

PATENT NO. : 4,891,837            Page 1 of 3

DATED : January 2, 1990

INVENTOR(S) : M. Walker; G. Kohler

It is certified that error appears in the above-identified patent and that said Letters Patent is hereby corrected as shown below:

On the Front Page

Abstract, line 5, after "feedback," insert -- a --.

In the Drawings

In FIG. 1 change "2C" to -- 20 --.

In FIG. 5 change multiplier "57" to -- 55 --.

In FIGS. 4, 12, 13, and 14 delete legends "V1" and "V2" from operational amplifier 54 and multiplier 55, respectively.

Column 2, line 30, delete the second "by".

Column 4, line 36, change "copuling" to -- coupling --.

Column 7, line 23, change "inset" to -- set --.

Column 7, line 49, change "frmaed" to -- framed --.

Column 7, line 64, change "ae" to -- are --.

Column 9, line 17, change "53" to -- 52 --.

Column 9, line 30, change "U4-U1" to -- U4·U2 --.

UNITED STATES PATENT AND TRADEMARK OFFICE
CERTIFICATE OF CORRECTION

PATENT NO. : 4,891,837

DATED : January 2, 1990

INVENTOR(S) : M. Walker; G. Kohler

It is certified that error appears in the above-identified patent and that said Letters Patent is hereby corrected as shown below:

Column 10, line 12, change "inset" to -- set --.

Column 10, line 58, change "93" to -- 98 --.

Column 10, lines 30,32,41,43,50 change "U1G" to -- $U_{1G}$ -- (all occurrences).

Column 10, line 67, change "U3G" to -- $U_{3G}$ --.

Column 11, lines 6,15,18,20,28,38,43, change "U3G" to -- $U_{3G}$ -- (all occurrences).

Column 11, line 10, change "U2G" to -- $U_{2G}$ --.

Column 11, line 26, change "U1" to -- $U_1$ --.

Column 11, line 63, change "UG" to -- $U_G$ --.

Column 11, line 68, change "-UT" to -- $-U_T$ --.

Column 12, line 3, change "-UR" to -- $-U_R$ --.

Column 12, line 7, change "US= UG-UT-UR" to -- $U_S = U_G - U_T - U_R$ --.

Column 12, line 14, change "US" to -- $U_S$ --.

Column 12, line 15, change "inset" to -- set --.

UNITED STATES PATENT AND TRADEMARK OFFICE
CERTIFICATE OF CORRECTION

PATENT NO.   :   4,891,837

DATED        :   January 2, 1990

INVENTOR(S)  :   M. Walker; G. Kohler

It is certified that error appears in the above-identified patent and that said Letters Patent is hereby corrected as shown below:

In the Claims

Column 12, line 53, change "compander" to -- compandor --.

Column 13, line 8, change "compander" to -- compandor --.

Column 13, line 22, change "thrid" to -- third --.

Signed and Sealed this

Eighth Day of October, 1991

Attest:

HARRY F. MANBECK, JR.

*Attesting Officer*    *Commissioner of Patents and Trademarks*